United States Patent
Cheah et al.

(10) Patent No.: US 6,475,842 B1
(45) Date of Patent: Nov. 5, 2002

(54) PROCESS FOR GATE OXIDE SIDE-WALL PROTECTION FROM PLASMA DAMAGE TO FORM HIGHLY RELIABLE GATE DIELECTRICS

(75) Inventors: Kean Syn Cheah; Hooi Peng Low, both of Singapore (SG); Yi Ma, Orlando, FL (US)

(73) Assignee: Agere Systems Inc., Orlando, FL (US)

( * ) Notice: Subject to any disclaimer, the term of this patent is extended or adjusted under 35 U.S.C. 154(b) by 0 days.

(21) Appl. No.: 09/634,401

(22) Filed: Aug. 9, 2000

(51) Int. Cl.[7] .................... H01L 21/336; H01L 21/8234

(52) U.S. Cl. ................ 438/197; 438/299; 438/303; 438/585; 438/595

(58) Field of Search ............................. 438/197, 299, 438/585, 765, 768, 770, 595, 230, 303; 257/288, 408

(56) References Cited

U.S. PATENT DOCUMENTS

| | | | | |
|---|---|---|---|---|
| 4,837,180 A | * | 6/1989 | Chao | 438/305 |
| 5,075,241 A | * | 12/1991 | Spratt et al. | 438/202 |
| 5,776,821 A | * | 7/1998 | Haskell et al. | 438/585 |
| 5,856,227 A | * | 1/1999 | Yu et al. | 438/305 |

\* cited by examiner

*Primary Examiner*—Matthew Smith
*Assistant Examiner*—Craig P. Lytle

(57) ABSTRACT

The present invention provides a method for manufacturing a semiconductor device. The method includes forming an oxidized portion of an initial gate structure and a sacrificial gate layer, and further includes removing the oxidized portion of the initial gate structure and the sacrificial gate layer to form a transistor device. In an exemplary embodiment, the method further includes subjecting a patterned gate layer to an etch to form the initial gate structure and the sacrificial layer. In an advantageous embodiment, the gate layer is patterned having a width greater than a predetermined design width.

17 Claims, 7 Drawing Sheets ially defined active devices, such as transistor poly gates and transistor gate oxides, which are subsequently interconnected to create components and very large scale integration (VLSI) or ultra large scale integration (ULSI) circuits. Equally well known is that the patterns defining the width of such devices are typically created by optical lithographic processes that involve the use of a mask and radiation, such as ultraviolet light, electron beams, or x-rays for a positive photoresist, to expose a pattern in the photoresist material. The exposed patterns in the photoresist are formed when the wafer undergoes the radiation exposure. The exposed portion of the photoresist is then removed and unexposed portions of the photoresist remains to protect the substrate regions that it covers. Locations from which photoresist has been removed can then be subjected to a variety of subsequent processing steps.

PROCESS FOR GATE OXIDE SIDE-WALL PROTECTION FROM PLASMA DAMAGE TO FORM HIGHLY RELIABLE GATE DIELECTRICS

TECHNICAL FIELD OF THE INVENTION

The present invention is directed, in general, to a method of manufacturing a semiconductor device and, more specifically, to a method of manufacturing a transistor device including a gate oxide, wherein the gate oxide side-wall is protected from plasma damage during formation.

BACKGROUND OF THE INVENTION

It is well known that microcircuit fabrication requires the formation of precisely defined active devices, such as transistor poly gates and transistor gate oxides, which are subsequently interconnected to create components and very large scale integration (VLSI) or ultra large scale integration (ULSI) circuits. Equally well known is that the patterns defining the width of such devices are typically created by optical lithographic processes that involve the use of a mask and radiation, such as ultraviolet light, electron beams, or x-rays for a positive photoresist, to expose a pattern in the photoresist material. The exposed patterns in the photoresist are formed when the wafer undergoes the radiation exposure. The exposed portion of the photoresist is then removed and unexposed portions of the photoresist remains to protect the substrate regions that it covers. Locations from which photoresist has been removed can then be subjected to a variety of subsequent processing steps.

Currently, transistor device formation involves a plasma etch step applied to the areas of the substrate layer left uncovered by the previous photoresist exposure and removal step described above. Typically the plasma etch is applied to remove only the poly gate layer; however, present etch technology is unable to accurately time the etch to remove all of the poly gate material without removing any of the gate oxide material. Thus, in an effort to appropriately remove all of the poly gate material, the poly gate is over etched, typically by about 10% of the poly gate thickness. However, as metal-oxide-semiconductor (MOS) technology continues to advance and the features of the MOS devices shrink, a scaling down in the vertical dimension of the gate oxide also occurs. The 10% overetch becomes substantial because typical gate oxide thicknesses are approaching 2.0 nm and below. For instance, if a poly gate having a thickness of 100 nm is over etched by 10%, i.e., 10 nm, the gate oxide having a 2.0 nm thickness is being completely etched, which results in damage to both the sidewall and the silicon substrate.

Removing portions of the gate oxide using the plasma etch is undesirable, because damage to the side-wall of the gate oxide might occur. The damage typically occurs when the ionic component of the plasma etch comes into contact with the side-wall of the gate oxide, causing traps to build up in the damaged side-wall of the gate oxide, which leads to easier hot carrier formation and deterioration of the gate oxide integrity during subsequent manufacturing steps and operation. Moreover, if the plasma etch contacts the silicon substrate, it might cause channel mobility degradation, gate oxide quality degradation and short hot carrier lifetime.

Accordingly, what is needed in the art is a method of manufacturing a semiconductor device, and more specifically a transistor device having a gate oxide, that does not experience the gate oxide problems associated with the prior art methods for manufacturing the transistor devices.

SUMMARY OF THE INVENTION

To address the above-discussed deficiencies of the prior art, the present invention provides a method for manufacturing a semiconductor device. The method includes forming an oxidized portion of an initial gate structure and a sacrificial gate layer, and further includes removing the oxidized portion of the initial gate structure and the sacrificial gate layer to form a transistor device. In an exemplary embodiment, the method further includes subjecting a patterned gate layer to an etch to form the initial gate structure and the sacrificial layer. In an advantageous embodiment, the gate layer is patterned having a width greater than a predetermined design width.

Thus, in an advantageous aspect of the present invention, a transistor is manufactured, including a gate and a gate oxide. Moreover, the gate oxide is manufactured such that the gate oxide sidewall is protected from plasma damage, resulting in a highly reliable gate dielectric, without encountering the problems associated with the prior art methods.

In one illustrative embodiment, the patterned gate layer is subjected to a plasma etch. Furthermore, in another illustrative embodiment, the oxidized portion is removed using a non-plasma etch, for example a chemical etch using hydrogen fluoride. The oxidized portion in an exemplary embodiment has a thickness ranging from about 1 nm to about 5 nm. By removing the oxidized portions, in an advantageous embodiment a gate is formed, including oxide spacers located adjacent the gate.

Another aspect of the present invention provides a semiconductor device manufactured using the method described above and a method of manufacturing an integrated circuit. The method of manufacturing an integrated circuit includes (1) forming transistors as described above, and (2) forming interconnects to connect the transistors to form an integrated circuit.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying FIGUREs. It is emphasized that in accordance with the standard practice in the semiconductor industry the various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
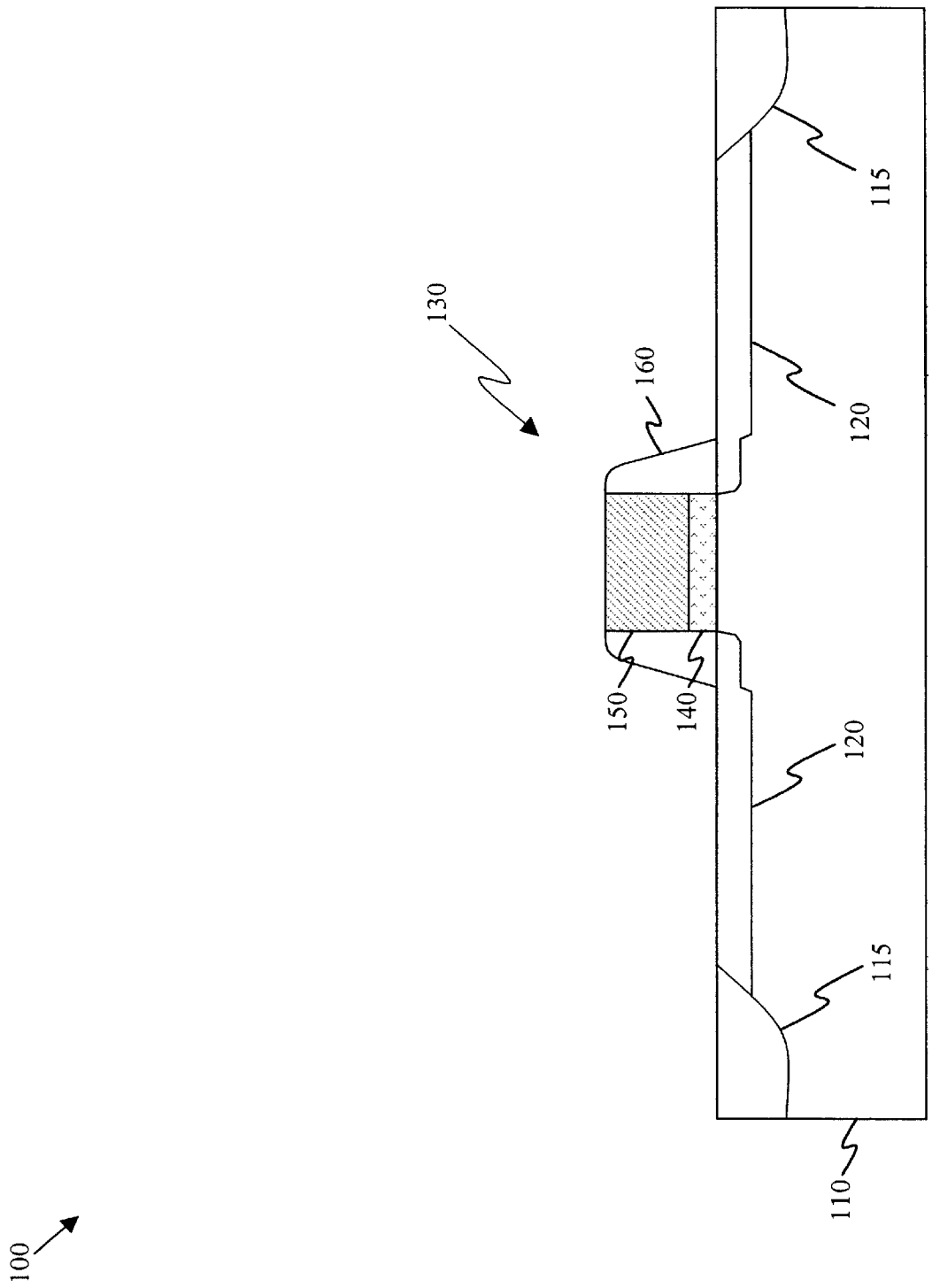
FIG. 1 illustrates a cross-sectional view of a completed semiconductor device manufactured by the method described in the present invention.

Referring initially to FIG. 1, illustrated is a cross-sectional view of a completed semiconductor device 100 manufactured by the method described herein. The semiconductor device 100 includes a semiconductor wafer substrate 110, field oxides 115 and source and drain regions 120. Also included in the semiconductor device 100 is a transistor 130, including a gate oxide 140 and poly gate 150, and oxide spacers 160. It should be noted that the semiconductor wafer substrate 110 may be any layer located in the semiconductor device 100, including the wafer itself or a layer located above the wafer.

The semiconductor device 100 manufactured according to the method described below does not experience the problems associated with semiconductor devices manufactured using prior art methods. More specifically, the gate oxide 140 is manufactured while reducing the plasma induced damage to the side-wall of the gate oxide 140, which in turn, improves the gate oxide 140 reliability from hot carrier induced damage. Moreover, the method does not use any additional mask layers, is easy to adapt to the current manufacturing process, and is scalable to smaller dimension devices.

Figure 2:
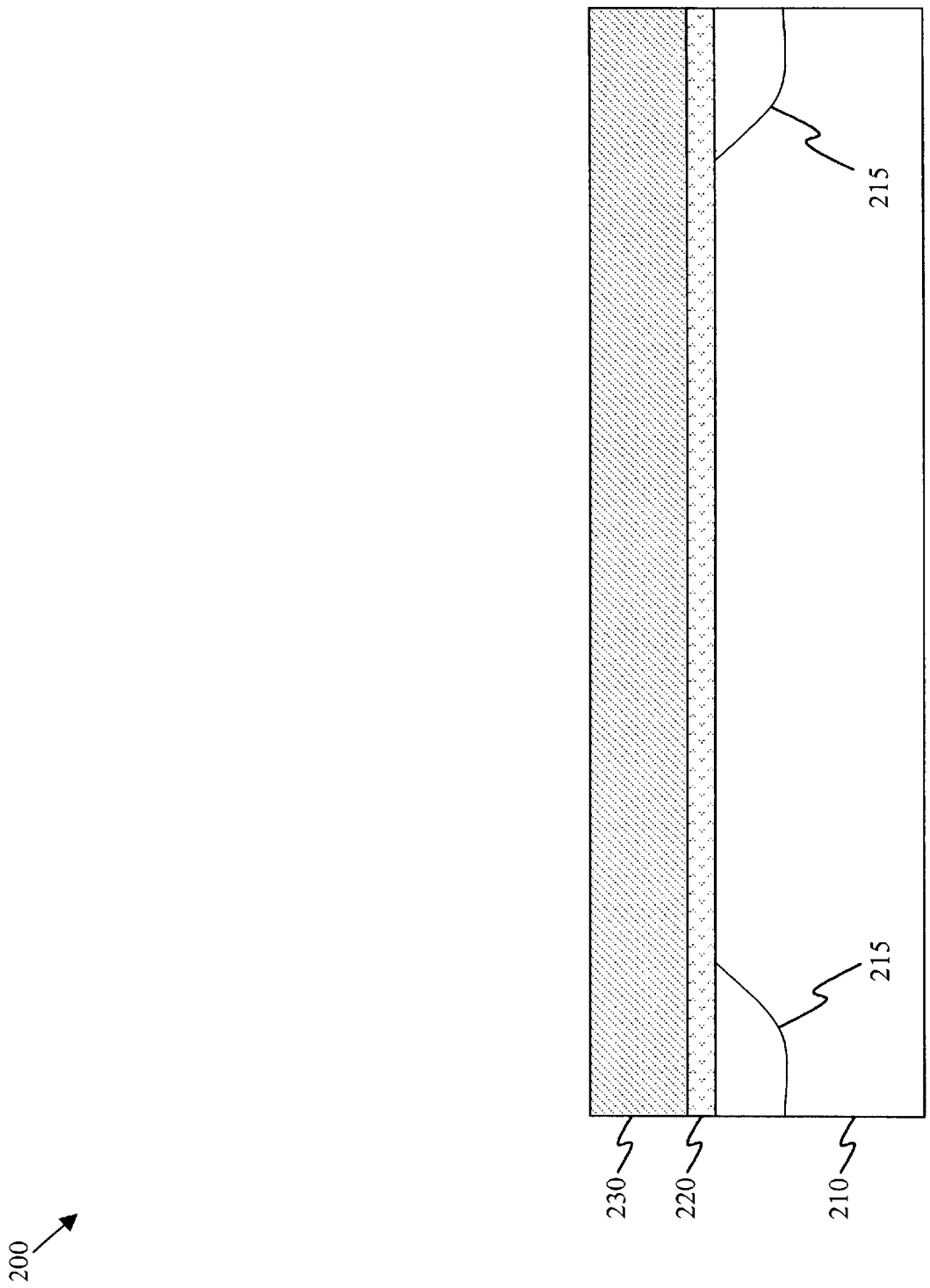
FIG. 2 illustrates a partially completed semiconductor device including a semiconductor wafer substrate, a gate oxide layer and a poly gate layer.

Turning to FIGS. 2–6, illustrated are various stages of manufacture of the completed semiconductor device 100 illustrated in FIG. 1. FIG. 2 illustrates a partially completed semiconductor device 200 including a semiconductor wafer substrate 210. Located within the semiconductor wafer substrate 210 are field oxides 215, formed in a prior step not shown. Moreover, depending on whether the partially completed semiconductor device is going to be a P-type metal oxide semiconductor (PMOS) device or an N-type metal oxide semiconductor (NMOS) device, the semiconductor wafer substrate 210 is conventionally doped with phosphorous or boron, respectively. Also, located over the semiconductor wafer substrate 210 are a conventionally formed gate oxide layer 220 and poly gate layer 230.

Figure 3:
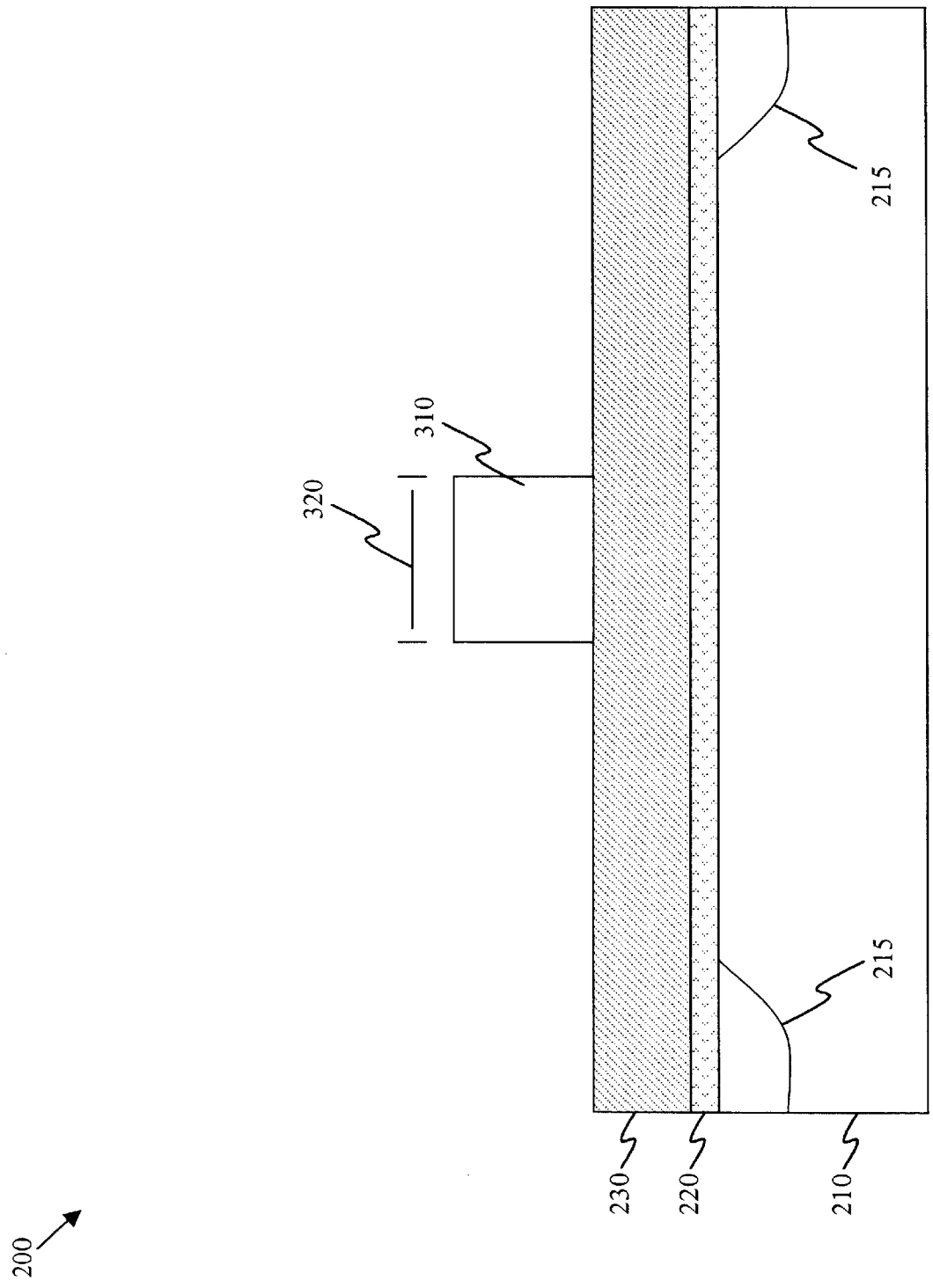
FIG. 3 illustrates the partially completed semiconductor device illustrated in FIG. 2, including a photoresist portion located over the gate oxide layer and poly gate layer where a transistor device is desired.

Turning to FIG. 3, illustrated is the partially completed semiconductor device 200 illustrated in FIG. 2, including a photoresist portion 310 located over the gate oxide layer 220 and poly gate layer 230 where the transistor device 130 (FIG. 1) is desired. One having skill in the art knows that to form the photoresist portion 310, a layer of photoresist material is conventionally deposited over the surface of the poly gate layer 230, patterned by exposing certain portions of the photoresist layer to radiation, and washed leaving the photoresist portion 310. The photoresist portion 310 may be patterned to a width 320 greater than a predetermined design width of the transistor device 130 (FIG. 1). For example, where the completed transistor device 130 (FIG. 1) width is desired to be 100 nm, the width 320 of the photoresist portion could range from about 150 nm to about 100 nm.

Figure 4:
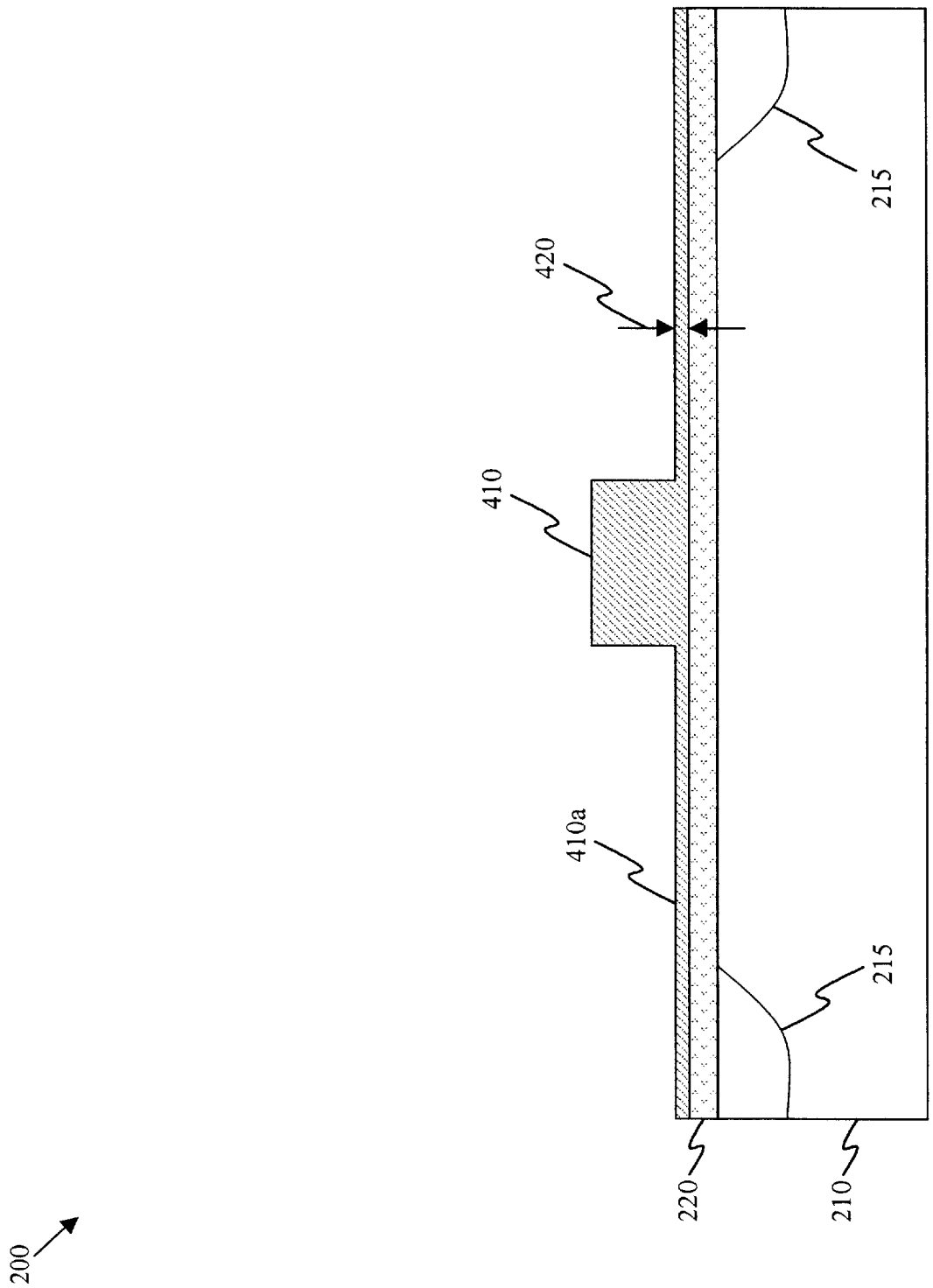
FIG. 4 illustrates the patterned gate layer of FIG. 3, after subjecting it to an etch to form an initial gate structure and a sacrificial layer.

Turning to FIG. 4, illustrated is the patterned gate layer 230 of FIG. 3, after subjecting it to an etch to form an initial gate structure 410 and sacrificial layer 410a. The etch, in an exemplary embodiment is a plasma etch, having ionized particles associated therewith. In one advantageous embodiment, the plasma etch may be conducted at a pressure ranging from about 8 mT to about 80 mT, an upper RF power ranging from about 200 watts to about 300 watts, a lower RF power ranging from about 80 watts to about 120 watts, all in the presence of gases including, but not limited to, chlorine, hydrogen bromide, and helium oxide. The etch results in a sacrificial layer 410a, typically having a thickness 420 ranging from about 1 nm to about 5 nm; however, other thicknesses 420 may be used as long as the plasma etch does not contact the gate oxide layer 220. More details of different exemplary etch recipes are illustrated in Table I, which follows:

TABLE I

|  | Bulk Etch | Slow Etch |
| --- | --- | --- |
| Pressure | 8–15 mT | 60–80 mT |
| RF (Upper) | 200–300 W | 200–300 w |
| RF (Lower) | 80–120 W | 80–120 w |
| cl$_2$ | 60–80 sccm | 0 sccm |
| HBr | 180–250 sccm | 150–200 sccm |
| HeO$_2$ | 7–8 sccm | 6–7 sccm |
| He | 0 sccm | 120–22 sccm |
| Gap | 5.5 cm | 5.5 cm |
| He Clamp | 8 T | 8 T |

Figure 5:
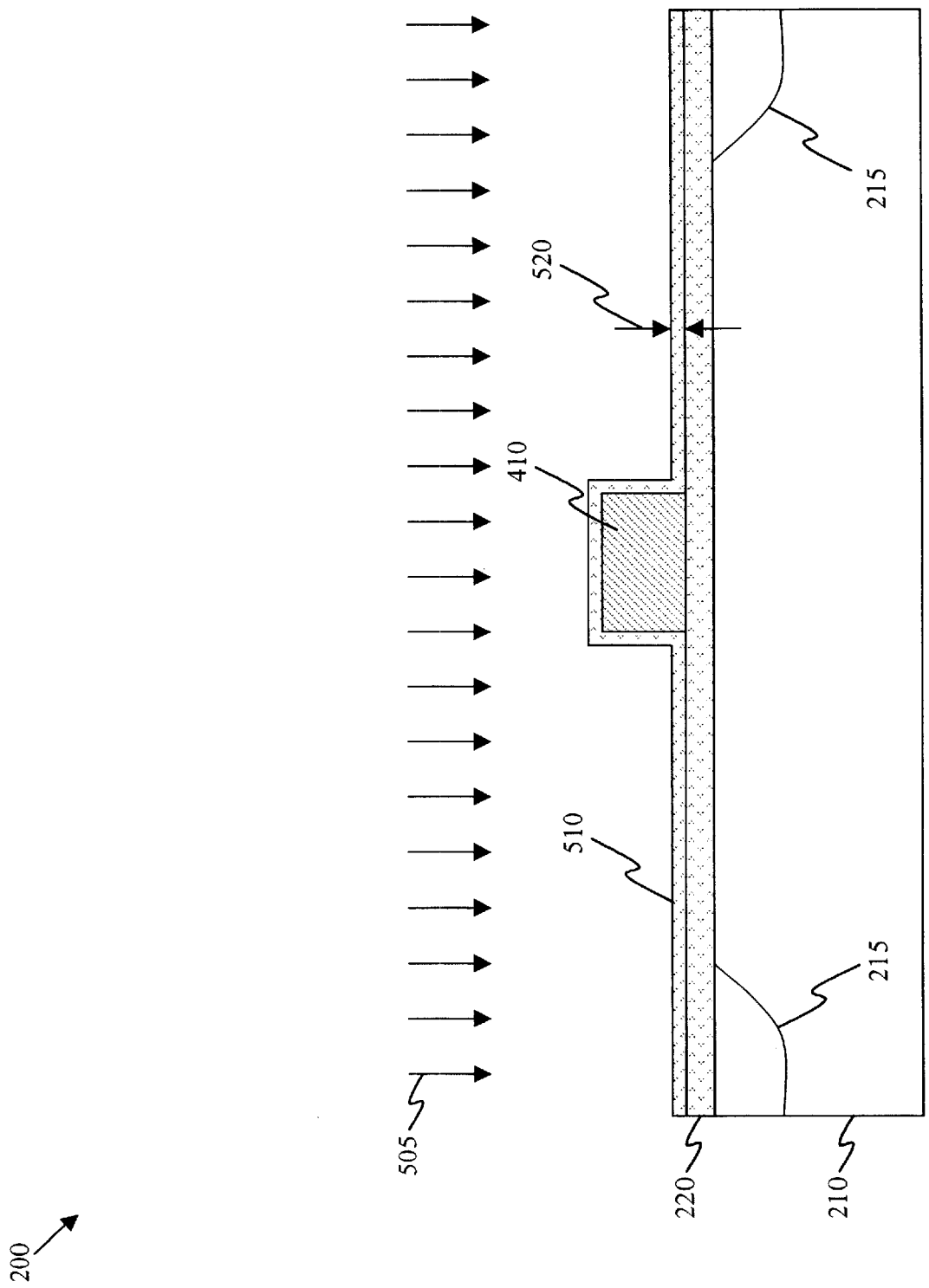
FIG. 5 illustrates the partially completed semiconductor device illustrated in FIG. 4 after forming an oxidized portion with the initial gate structure and sacrificial layer.

Turning to FIG. 5, illustrated is the partially completed semiconductor device 200 illustrated in FIG. 4 after forming an oxidized portion 510 with the initial gate structure 410 and sacrificial layer 410a. The oxidized portion 510 is typically formed by flowing an oxygen containing gas 505 over the surface of the initial gate structure 410 and sacrificial layer 410a. (FIG. 4). Wherein the sacrificial layer 410a. typically has thickness ranging from about 1 nm to about 5 nm, the oxidized portion 510 typically has a width 520 about 40% wider than the sacrificial layer 410a, because of a phenomena called volume expansion. For example, if the sacrificial layer 410a. has a thickness of about 5 nm, the oxidized portion 510 could have a thickness of about 7 nm. However, the oxidized portion 510 should contain all of the sacrificial layer 410a. described above. The oxidation process typically is initially conducted in the presence of oxygen at about 800° C. and for a period of time ranging from about 80 minutes to about 100 minutes, followed by a nitrogen anneal for a period of time ranging from about 15 minutes to about 30 minutes.

Figure 6:
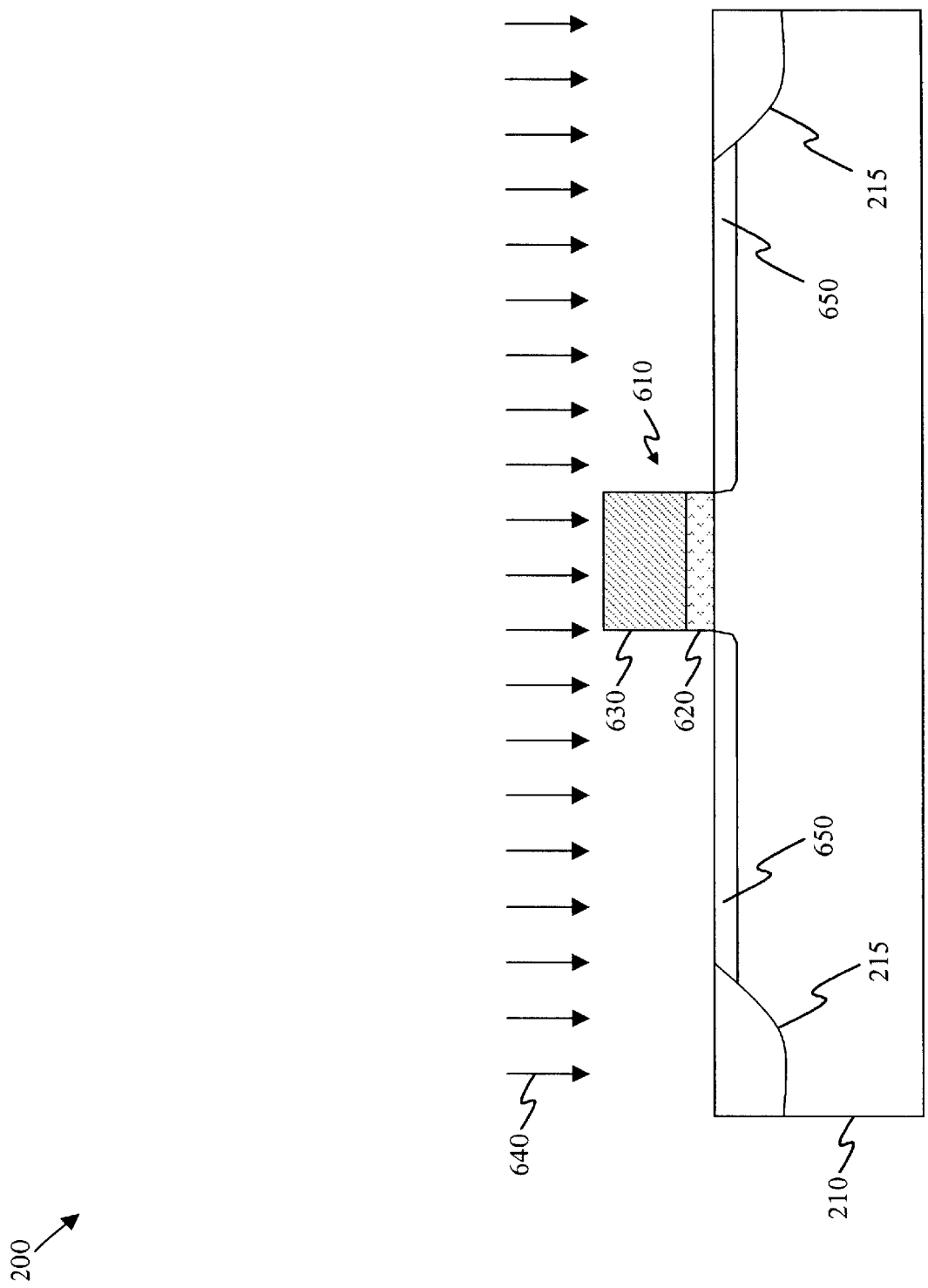
FIG. 6 illustrates the removal of the oxidized portion illustrated in FIG. 5.

Turning to FIG. 6 with brief references to FIG. 5, illustrated is the removal of the oxidized portion 510 illustrated in FIG. 5. The oxidized portion 510 is typically removed, thus forming a transistor device 610, including a gate oxide 620 and a poly gate 630, by subjecting the oxidized portion 510 to a non-plasma etch. For example, a chemical etch, or more specifically a hydrofluoric (HF) etch, could be used to remove the oxidized portion 510. A typical HF etch could be conducted in a solution of 100 parts deionized water to one part hydrogen fluoride for about 100 seconds, followed by a first standard clean using a 1:1:5 solution of ammonium hydroxide, hydrogen peroxide and water, respectively. After the first standard clean, a second standard clean may be conducted wherein the second standard clean uses a 1:1:5 solution of hydrochloric acid, hydrogen peroxide and water, respectively. As mentioned previously, the gate oxide 620 is patterned and formed, using the oxidized portion 510 to protect the side-wall of the gate oxide 620 from damage caused by the plasma etch used to pattern the poly gate 630. Therefore, the transistor device 610, and more specifically the gate oxide 620, is manufactured using a method such that the transistor device 610 does not experience the problems associated with the prior art transistor devices.

After removal of the oxidized portion 510, the semiconductor device 200 is typically subjected to a lightly doped (LDD) source/drain implant 640, resulting in lightly doped source/drain regions 650. The LDD implant 640 can be either an P-type LDD implant or an N-type LDD implant, depending on whether it is located within an PMOS device or an NMOS device, respectively. After the formation of the lightly doped source/drain regions 650, a conventionally formed tetraethylorthosilicate (TEOS) spacer layer is deposited and an anisotropic spacer etch is performed on the TEOS spacer layer to form oxide spacers 160 (FIG. 1). After formation of the oxide spacers 160 (FIG. 1) the partially completed semiconductor device 200 undergoes a standard source/drain implant. Similar to above, the standard source/drain implant may be a P-type standard source/drain implant or an N-type standard source drain implant depending on whether it is located within an PMOS device or an NMOS device, respectively. What results is the completed semiconductor device as previously illustrated in FIG. 1.

Figure 7:
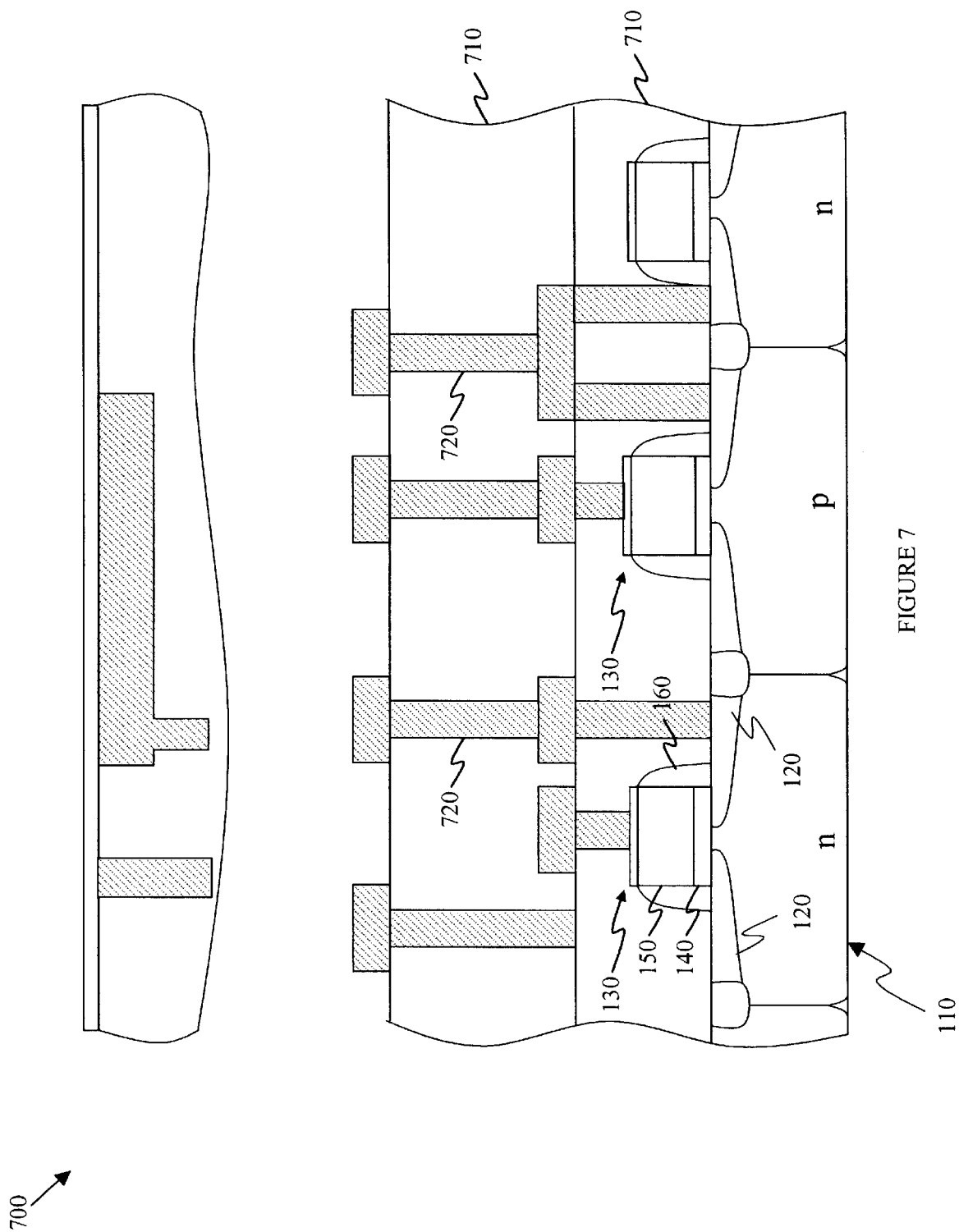
FIG. 7 illustrates a sectional view of a conventional integrated circuit, which might be manufactured according to the principles of the present invention.

Turning briefly to FIG. 7 with continued reference to FIG. 1, there is illustrated a sectional view of a conventional integrated circuit 700, that might be manufactured according to the principles of the present invention. The integrated circuit 700 may include complementary metal oxide semiconductor (CMOS) devices, bi-complementary metal oxide semiconductor (BiCMOS) devices, Bipolar devices, electrically erasable programable read-only memory (EEPROM) devices, including Flash electrically programable read only (EPROM) devices, or any other type of similar device. Also shown in FIG. 7, are components of the conventional integrated circuit 700, including: the semiconductor wafer substrate 110, the source and drain regions 120, the transistors 130, including the gate oxide 140 and the poly gate 150, the oxide spacers 160, dielectric layers 710 and interconnects 720. The interconnects 720 electrically connect the transistors 130 to form an integrated circuit 700.

Although the present invention has been described in detail, those skilled in the art should understand that they can make various changes, substitutions and alterations herein without departing from the spirit and scope of the invention in its broadest form.

What is claimed is:

1. A method for manufacturing a semiconductor device, comprising:
    etching a gate layer to form an initial gate structure and a sacrificial gate layer;
    oxidizing a portion of an initial gate structure and substantially all of a sacrificial gate layer;
    removing the oxidized portion of the initial gate structure and the oxidized sacrificial gate layer to form a gate; and
    forming oxide spacers adjacent the gate.

2. The method as recited in claim 1 further including subjecting a patterned gate layer to an etch to form the initial gate structure and the sacrificial layer.

3. The method as recited in claim 2 wherein subjecting a patterned gate layer to an etch includes subjecting a patterned gate layer having a width greater than a predetermined design width.

4. The method as recited in claim 2 wherein subjecting a patterned gate layer to an etch includes subjecting a patterned gate layer to a plasma etch.

5. The method as recited in claim 4 wherein removing the oxidized portion and the oxidized sacrificial gate layer includes removing using a non-plasma etch.

6. The method as recited in claim 5 wherein removing using a non-plasma etch includes removing using a chemical etch.

7. The method as recited in claim 1 wherein oxidizing includes oxidizing a thickness ranging from 1 nm to 5 nm.

8. A semiconductor device manufactured using the process recited in claim 1.

9. A method for manufacturing an integrated circuit, comprising:
    forming transistors, including;
        etching a gate layer to form an initial gate structure and a sacrificial gate layer;
        oxidizing a portion of an initial gate structure and substantially all of a sacrificial gate layer;
        removing the oxidized portion of the initial gate structure and the oxidized sacrificial gate layer to form a gate; and
        forming oxide spacers adjacent the gate; and
    forming interconnects to connect the transistors to form an integrated circuit.

10. The method as recited in claim 9 further including subjecting a patterned gate layer to an etch to form the initial gate structure and the sacrificial layer.

11. The method as recited in claim 10 wherein subjecting a patterned gate layer to an etch includes subjecting a patterned gate layer having a width greater than a predetermined design width.

12. The method as recited in claim 10 wherein subjecting a patterned gate layer to an etch includes subjecting a patterned gate layer to a plasma etch.

13. The method as recited in claim 12 wherein removing the oxidized portion and the oxidized sacrificial gate layer includes removing using a non-plasma etch.

14. The method as recited in claim 13 wherein removing using a non-plasma etch includes removing using a chemical etch.

15. The method as recited in claim 9 wherein oxidizing includes oxidizing a thickness ranging from 1 nm to 5 nm.

16. The method as recited in claim 9 wherein forming transistors includes forming semiconductor devices selected from the group consisting of:
    Bipolar devices,
    Bi-complementary metal oxide semiconductor devices, and
    Complementary metal oxide semiconductor devices.

17. An integrated circuit manufactured using the process recited in claim 9.

* * * * *